Jan. 30, 1968 P. R. HANSON 3,366,833
MAGNETRON HAVING TUNING RODS WITH LARGER CROSS SECTIONAL DIMENSION THAN THEIR ALIGNING GROOVES IN THE RESONATOR
Filed May 18, 1964 2 Sheets-Sheet 1

FIG. I

INVENTOR.
PER R. HANSON
BY Harry E. Aine
ATTORNEY

Jan. 30, 1968 P. R. HANSON 3,366,833

MAGNETRON HAVING TUNING RODS WITH LARGER CROSS SECTIONAL DIMENSION THAN THEIR ALIGNING GROOVES IN THE RESONATOR

Filed May 18, 1964 2 Sheets-Sheet 2

INVENTOR.
PER R. HANSON

BY [signature]

ATTORNEY

United States Patent Office
3,366,833
Patented Jan. 30, 1968

3,366,833

MAGNETRON HAVING TUNING RODS WITH LARGER CROSS SECTIONAL DIMENSION THAN THEIR ALIGNING GROOVES IN THE RESONATOR

Per R. Hanson, Winchester, Mass., assignor to Varian Associates, Palo Alto, Calif., a corporation of California Filed May 18, 1964, Ser. No. 368,306
3 Claims. (Cl. 315—39.61)

ABSTRACT OF THE DISCLOSURE

A mechanically tunable crossed-field microwave tube is disclosed. The tube includes an interaction circuit formed by an array of coupled vane resonators for interaction with an electron stream to produce the output signal. A tuner structure is provided for tuning the output signal over a band of frequencies. The tuning structure includes an array of tuning rods with conductive flag members which are axially movable within the inductive regions of the vane resonators for tuning thereof. The back walls of the vane resonators are provided with an array of elongated aligning grooves to receive the tuning rods in slidable engagement therewith. The aligning grooves are formed in such a manner that they have, in cross section a radius of curvature, which is less than the radius of curvature of the rods, in cross section, whereby the tuning members make slidable physical contact with said aligning grooves on opposite sides of each of said rods. In one embodiment, the aligning grooves are of V-shape in cross section. The aligning grooves which provide physical and electrical contact on opposite sides of the tuning rods facilitate maintaining proper alignment of the rods within the vane resonator structures and, in addition, insure that a good electrical connection will be made to the tuning rods, whereby microwave energy is not lost in poor electrical contacts between the tuning rods and the resonator structures.

Figure 1:
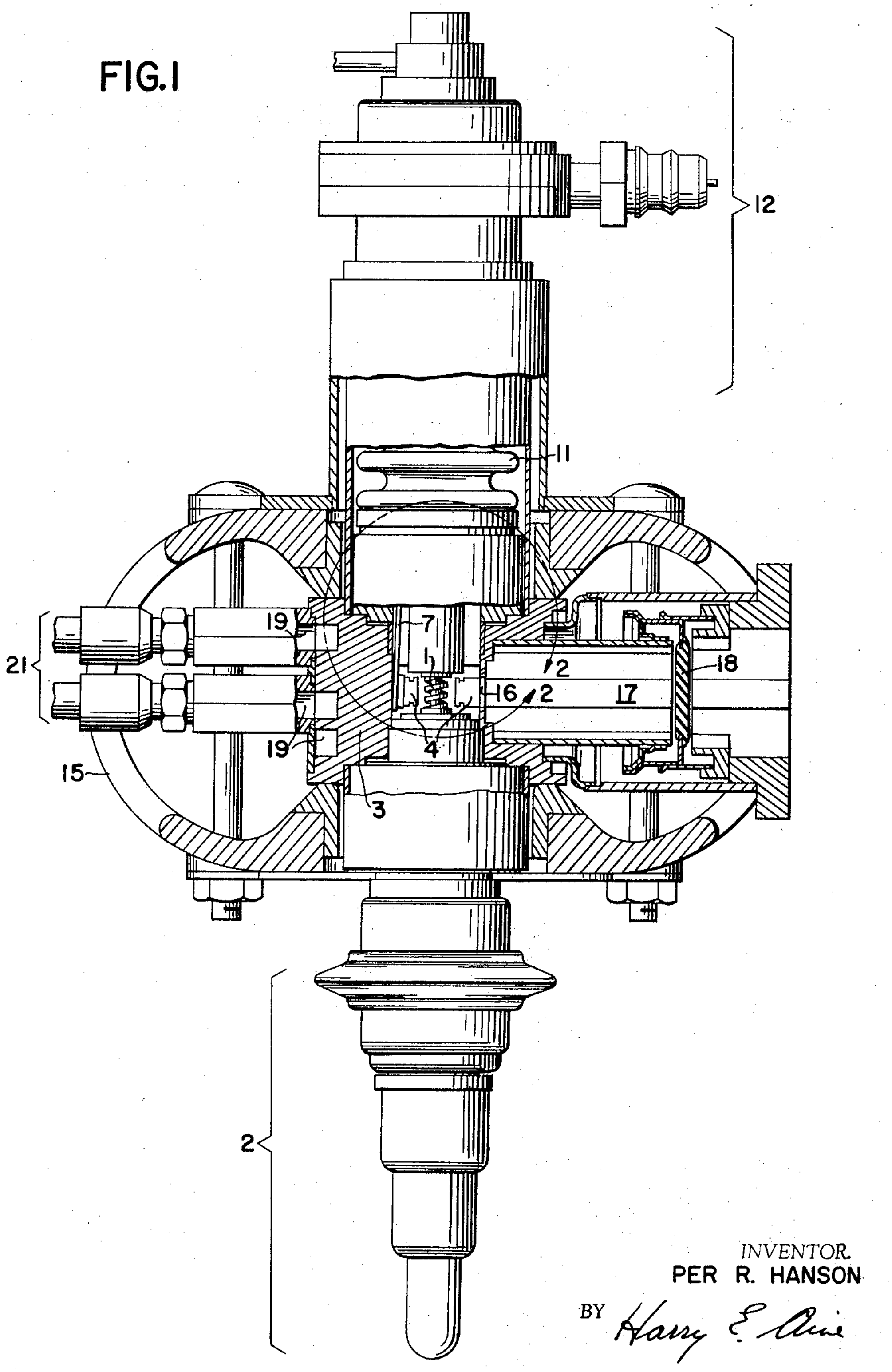

The present invention relates in general to crossed field electrical discharge devices and more particularly to an improved inductive tuner for vane resonators or coupled vane structures in crossed field microwave tubes. Such improved tuning structure is especially useful in tunable magnetron oscillators employed as high power C.W. output tubes for high power transmitters.

Heretofore inductive plug type tuners have been employed for tuning magnetron oscillators. In these prior designs a circular array of vane resonators formed in the magnetron were individually tuned in unison to tune the tube. The tuning structure comprised a circular array of axially directed conductive pins that were outwardly tensioned and bore in axially slidable engagement with the back wall of each of the vane resonators. Conductive flags were affixed to the innermost ends of the rods and projected from the rods radially inwardly of the vane resonators to increase their inductive tuning effect. The rods were designed to have a radius of curvature, in cross section, less than the radius of curvature of the curved back wall of the resonators such that only a single conductive connection was made between the inductive rods and the cavity back wall. The axial movement of the rods and flags caused variable displacement of the R.F. magnetic field lines in the coupled resonators thereby tuning the magnetron over a relatively broad band of frequencies such as 20% of the center frequency at X band.

Some of the problems associated with this prior tuner were that it was very difficult, because of the small tolerances involved, to properly circumferentially align the tuning rods in all of the resonators. Slight out of alignment in the circumferential direction caused some of the tuners to make contact with the side walls of the vane resonators thereby tuning these certain cavities to slightly different frequencies than the other cavities. Also, this side wall contact results in the exciting of parasitic modes of oscillation reducing the power output of the tube for the desired frequencies. In addition, the misalignment of the tuning structure results in poor electrical contact causing power loss and hence reduction in output power.

In a preferred embodiment of the present invention the back wall of the vane or resonator structure is provided with an axially directed aligning groove formed, in cross section, such that the tuning rod which makes slidable engagement therewith makes simultaneous electrical contact over two portions on opposite sides of an axial plane bisecting the tuning rod and the axial center line of the tube whereby improved electrical contact is obtained between the tuner rod and the individual resonators and proper circumferential alignment of the tuning rods in the vane or resonator structure is facilitated. Moreover, the axial grooves serve to guide the tuning rods to prevent misalignment in use. As a result the performance of the tube over its tuning range is greatly enhanced in that power output is uniformly higher and less subject to pronounced changes with frequency over the band.

The principal object of the present invention is to provide crossed field microwave tube having improved tuning characteristics useful in high power transmitters and the like.

One feature of the present invention is the provision of an axially directed aligning groove in the back wall of a coupled vane or resonator structure for slidably receiving the tuning rod therein to assure proper circumferential alignment of the rod.

Another feature of the present invention is the same as the preceding feature wherein the aligning groove is formed in cross section such that the rod makes simultaneous electrical contact with the back wall of the resonator structure on opposite sides of an axial plane bisecting the rod and the axial center line of the tube structure.

Another feature of the present invention is the same as the preceding feature wherein the aligning groove has a radius of curvature less than the radius of curvature, in cross section, of the tuning rod whereby proper alignment and electrical contact for the tuner is enhanced.

Figures 2, 3, 4, 5, 6:
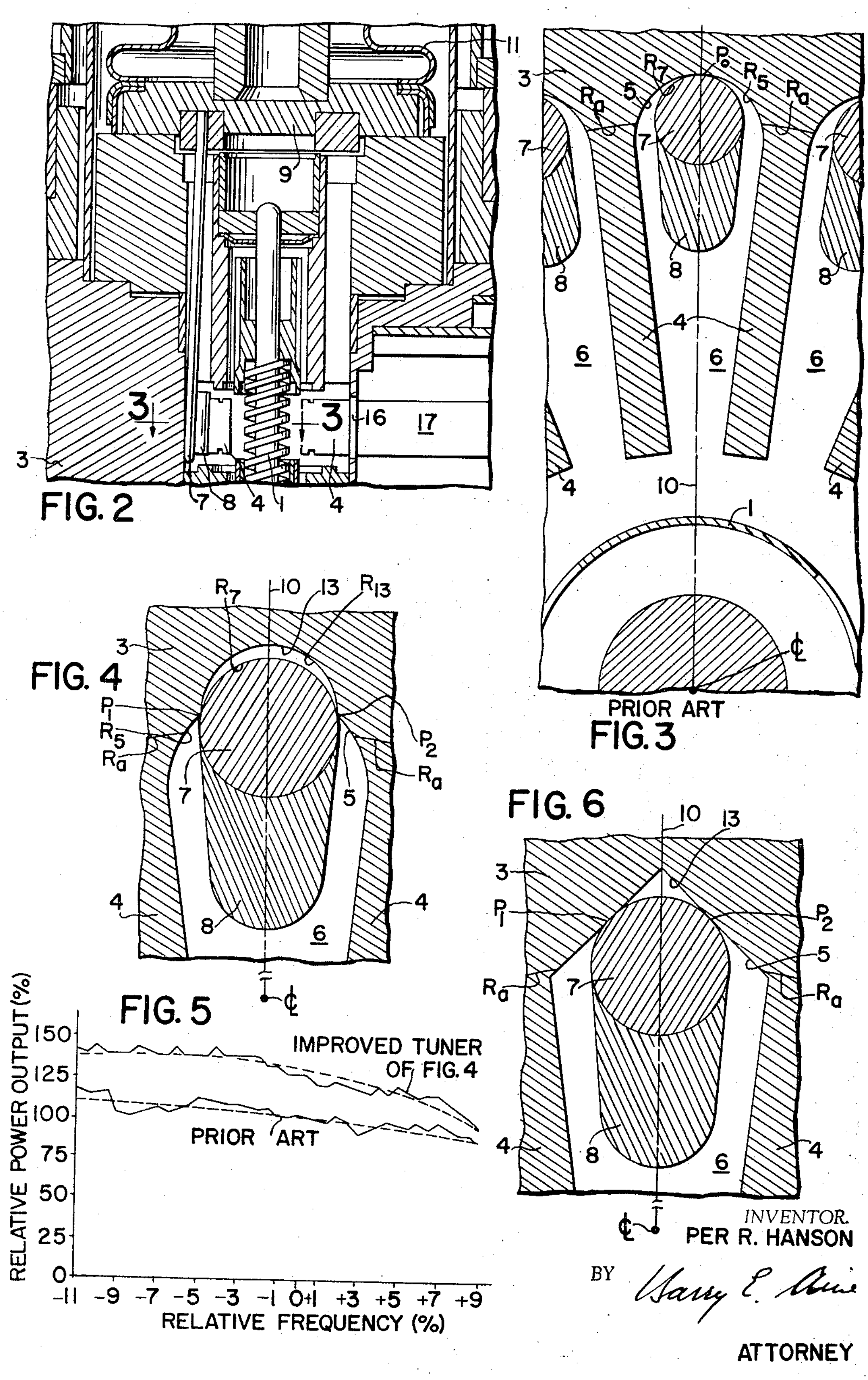

Other features and advantages of the present invention will become apparent upon a perusal of the following specification taken in connection with the accompanying drawings wherein:

FIG. 1 is a longitudinal view partly in section showing a crossed field tube apparatus employing features of the present invention, FIG. 2 is an enlarged longitudinal sectional view of a portion of the structure of FIG. 1 delineated by line 2—2, FIG. 3 is an enlarged fragmentary transverse cross sectional view of that part of the prior art tuner structure taken along line 3—3 of FIG. 2 in the direction of the arrows, FIG. 4 is an enlarged cross sectional view of a portion of an alternative tuning structure to that of FIG. 3 employing the features of the present invention, FIG. 5 is a graph of normalized power output versus frequency showing the improved power output characteristics as contrasted with the similar prior art characteristic, and FIG. 6 is an alternative structure to that of FIG. 4.

Referring now to FIG. 1 there is shown in longitudinal section a magnetron oscillator embodying features of the present invention. More specifically a helical directly heated thermionic cathode emitter 1 is disposed centrally of the tube on its axis of symmetry ℄. A conventional high voltage lead in assembly 2 supplies a high negative voltage to the emitter 1 relative to a main body or anode 3.

The anode or main body 3 as of copper includes a circular array of anode vanes 4 as of copper radially projecting inwardly toward the cathode emitter 1 from an inner back cylindrical wall 5 of the anode body 3. The vanes 4 are approximately a quarter electrical wavelength long in the radial direction from the back wall 5 to their innermost ends or tips.

The vanes thereby define an array of conventional coupled vane resonators or cavities 6 defined by the pie-like spaces between adjacent vanes 4. The cavities 6 include a predominately inductive region adjacent the back wall 5 where the magnetic field lines are most intense and associated circumferential cavity wall currents are most intense. A predominately capacitive region is provided near the free ends or tips of the vanes where the electric fields are most intense and where their associated displacement currents are most intense.

The cavities 6 are tuned by a circular array of axially directed conductive pins or rods 7 as of tungsten which are outwardly tensioned to bear in slidable engagement with the back wall 5 of the cavities 6 as of copper. The rods 7 carry conductive flags 8 as of copper therefrom as by being brazed thereto. The rods 7 are carried from an axially translatable plunger 9 which is vacuum sealed to the tube's vacuum envelope via the intermediary of a cylindrical bellows 11 to allow translation of the tuning rods 7 through the vacuum envelope. As the rods 7 and their associated flags 8 penetrate further into the cavity resonators 6 they displace more volume of R.F. magnetic field lines thereby increasing the resonant frequency of the magnetron oscillator.

The plunger 9 and rods 7 are actuated by means of a conventional hydraulic tuning actuator assembly 12 projecting outwardly from the tube body 3 from the opposite side to that of the high voltage cathode feed through assembly 2.

In the prior art as shown in FIG. 3 the back wall 5 had an inner surface curvature $R_5$ in section, which was greater than the radius of curvature $R_7$ of the tuning rod 7 whereby the tuning rod was supposed to make electrical contact with the center of the back wall 5 at $P_0$ to divert the cavity current around the rod 7 and the conductive flag 8. However, it was found that the tuning rod 7 was extremely difficult to properly align and often assumed an unsymmetrical position in the cavity 6 which excited certain parasitic microwave modes of oscillation associated with the rod 7 and flag 8. In addition, due to the misalignment, the rods 7 and flags 8 would often make poor electrical contact with the sides of the vanes 4 and back of the resonators 6 causing loss of power in the poor electrical connections.

Referring now to FIG. 4 there is shown a preferred embodiment of the cavity construction of the present invention. More particularly the back wall 5 of the resonator 6 is provided with an axially directed aligning groove 13. The groove has a radius of curvature $R_{13}$, in section, which is less than the radius of curvature $R_7$ of the rod 7 whereby the rod 7 axially rides in the groove 13 and makes good electrical contact with the back wall 5 of the cavity 6 at two points $P_1$ and $P_2$ on opposite sides of an axial plane 10 passing through the center line ℄ of the tube and bisecting the tuner rod 7. As used herein "aligning groove" is defined to mean a groove 13 so formed with respect to the tuning rod 7 that initially physical contact is simultaneously obtained between the rod 7 and the wall 5 on opposite sides of an axially directed plane which bisects the rod 7 and the center line ℄ of the tube.

This two point contact for the rod 7 greatly facilitates achieving proper circumferential alignment of the array of tuning rods and flags and greatly diminishes loss of power due to poor electrical contact between the inductive tuning rods 7 and the cavity wall 5. Moreover, due to enhanced alignment certain parasitic modes of oscillation associated with the tuner are not excited and consequently the power output of the tube is increased over the tuning band and the undesired fluctuations in power output with frequency are reduced over the band as shown in FIG. 5.

In a typical example at X band the rod 7 has a radius of curvature $R_7$ of .0205", the groove 13 has a radius of curvature $R_{13}$ of .019", the back wall 5 has a radius of curvature of $R_5$ of .028" and the anode bore $R_a$ has a radius of curvature of .350".

Referring now to FIG. 6 there is shown an alternative tuner guide groove structure of the present invention. In this embodiment the aligning groove 13 is of V-shape, in cross section, to provide, initially, two points of electrical contact, $P_1$ and $P_2$, on opposite sides of the axial plane 10 which bisects the tuner rod 7 and axial center line ℄ of the tube.

In both embodiments of FIGS. 4 and 6 in which the aligning groove 13 is provided, the groove 13 serves the function of providing proper initial alignment of the tuning rods 7. As the tuner is operated in use the hard tungsten rods 7 will wear into the groove 13 such as to seat themselves therein. When seated in the grooves 13 after many cycles of operation as of 10's of millions, the areas of electrical contact, $P_1$ and $P_2$, will increase on opposite sides of the axial and radial planes 10 which radially bisect the rods 7. While the aligning grooves 13 have been shown of circular and V-shapes they may take any convenient cross sectional shape such as rectangular, etc. to provide the two point contact.

In operation (see FIGS. 1 and 2) the tube is evacuated to a low pressure as of $10^{-7}$ mm. Hg. A high negative potential is applied to the thermionic cathode emitter 1 relative to the anode body 3 and vane resonators 6. An axial magnetic field is produced by a bowl-shaped magnet 15 in the region of space between the cathode emitter 1 and anode vane tips to produce circumferentially rotating spokes of electrons electromagnetically interacting with the electric fields of the coupled vane resonators 6 in the conventional manner. One of the tuner rods 7 is missing in one of the resonators 6 and an axial coupling slot 16 communicates through the anode body and back wall 5 of that resonator cavity 6 for extracting wave energy from the magnetron. The coupling slot communicates with the ridge loaded rectangular waveguide 17 vacuum sealed by a wave permeable R.F. window 18 extending across the guide 17. The microwave energy passes out of the tube via the sealed waveguide 17 to a suitable utilization circuit or device not shown.

A fluid coolant, for example, water is piped through suitable cooling channels 19 in the anode body 3 for cooling of the tube in use. The coolant is supplied and removed via pipes 21.

Since many changes could be made in the above construction and many apparently widely different embodiments could be made without departing from the scope thereof, it is intended that all matter contained in the above description or shown in the accompanying drawings shall be interpreted as illustrative and not in a limiting sense.

What is claimed is:

1. In a crossed magnetic and electric field discharge apparatus; means forming an array of coupled vane resonators including, means defining a conductive back wall, an array of conductive vane members projecting from said conductive back wall, said conductive vane members defining regions of space immediately adjacent said back wall to form predominately the inductive regions of said vane resonators, said conductive vane members also defining predominately capacitive regions of space disposed more remote from said back wall; means for producing a stream of electrons adjacent said array of vane resonators for cumulative electromagnetic interaction with the electric field of said predominately capacitive regions of said vane resonators; means for tuning said vane resonators including, a plurality of conductive tuning members moveable within said predominately inductive region of said vane resonators for tuning thereof; said conductive back wall having a plurality of elongated aligning grooves formed therein in said inductive region thereof to receive said conductive tuning members in slideable engagement with said grooves and for making electrical contact with said grooves in said conductive back wall, the improvement wherein, said aligning grooves are shaped and dimensioned in cross-section relative to the cross-sectional shape and dimensions of said conductive tuning members such that said tuning members make slideable physical and electrical contact with said aligning grooves on opposite sides of each of said tuning members.

2. The apparatus according to claim 1 wherein said vane resonators are formed into a circular array, and wherein said tuning members are formed into a circular array which is axially slideable of said circular array of vane resonators for tuning same.

3. The apparatus according to claim 1 wherein said aligning grooves are of V-shape in cross section.

References Cited

UNITED STATES PATENTS

| | | | |
|---|---|---|---|
| 2,906,920 | 9/1959 | Crapuchettes | 315—39.61 |
| 3,046,446 | 7/1962 | Sibley | 315—39.61 |

HERMAN KARL SAALBACH, *Primary Examiner.*

ELI LIEBERMAN, P. L. GENSLER, *Examiners.*